(12) United States Patent
Lu et al.

(10) Patent No.: US 7,289,330 B2
(45) Date of Patent: Oct. 30, 2007

(54) HEAT SINK ASSEMBLY HAVING A FAN MOUNTING DEVICE

(75) Inventors: Cui-Jun Lu, Guangdong (CN);
Ling-Bo Cao, Guangdong (CN);
Song-Shui Liu, Guangdong (CN)

(73) Assignees: Fu Shun Precision Industry (Shen Zhen) Co., Ltd., Longhaua Town, Bao'an District, Shenzhen, Guangdong Province; Foxconn Technology Co., Ltd., Tu-Cheng, Taipei Hsien (TW)

( * ) Notice: Subject to any disclaimer, the term of this patent is extended or adjusted under 35 U.S.C. 154(b) by 183 days.

(21) Appl. No.: 11/164,095

(22) Filed: Nov. 10, 2005

(65) Prior Publication Data
US 2007/0103872 A1 May 10, 2007

(51) Int. Cl.
*H05K 7/20* (2006.01)
(52) U.S. Cl. .............. 361/710; 361/702; 361/703; 361/704; 361/707; 361/709; 165/80.3; 165/121; 165/104.33; 165/125; 165/185; 439/487; 257/718; 257/E23.084; 257/E23.086; 257/E23.099; 174/16.1; 174/16.3; 24/453; 24/457; 248/510
(58) Field of Classification Search ............... 361/687, 361/697, 702, 703, 704, 707, 709, 710, 719; 257/E23.084, E23.086, E23.099, 718; 24/453; 165/80.3, 185, 121, 76, 125; 439/487
See application file for complete search history.

(56) References Cited
U.S. PATENT DOCUMENTS

| | | | | |
|---|---|---|---|---|
| 5,486,980 A | | 1/1996 | Jordan et al. | |
| 5,999,402 A | * | 12/1999 | Jeffries et al. | 361/687 |
| 6,272,014 B1 | * | 8/2001 | Lo | 361/704 |
| 6,330,160 B1 | * | 12/2001 | Ayres et al. | 361/707 |
| 6,374,906 B1 | * | 4/2002 | Peterson et al. | 165/80.3 |
| 6,392,889 B1 | * | 5/2002 | Lee et al. | 361/704 |
| 6,396,697 B1 | * | 5/2002 | Chen | 361/704 |
| 6,654,246 B2 | | 11/2003 | Wu | |
| 6,667,884 B1 | * | 12/2003 | Lee et al. | 361/697 |
| 6,795,317 B1 | * | 9/2004 | Liu | 361/704 |
| 6,809,926 B2 | | 10/2004 | Liu | |
| 6,816,373 B2 | * | 11/2004 | Lee et al. | 361/697 |
| 6,896,046 B2 | * | 5/2005 | Lee et al. | 165/185 |
| 6,995,981 B2 | * | 2/2006 | Huang et al. | 361/703 |
| 7,086,456 B2 | * | 8/2006 | Lee et al. | 165/121 |
| 7,106,591 B2 | * | 9/2006 | Fan et al. | 361/704 |
| 7,126,823 B2 | * | 10/2006 | Chen et al. | 361/702 |
| 7,180,743 B2 | * | 2/2007 | Chen et al. | 361/704 |
| 7,215,550 B1 | * | 5/2007 | Yang et al. | 361/704 |
| 7,232,332 B2 | * | 6/2007 | Osborn et al. | 439/487 |
| 2006/0067056 A1 | * | 3/2006 | Lin | 361/709 |
| 2006/0268523 A1 | * | 11/2006 | Lin | 361/710 |

* cited by examiner

*Primary Examiner*—Boris Chérvinsky
*Assistant Examiner*—Courtney Smith
(74) *Attorney, Agent, or Firm*—Winston Hsu

(57) ABSTRACT

A heat sink assembly (100) includes a heat sink (10) having a plurality of fins (14), a fan handle (24) buckled with the fins and a fan (30) mounted on the heat sink (10) via the fan handle. The fan handle includes a retaining body (26) clasping two adjacent fins having a space therebetween. A screw (22) is extended through the fan and into the space of the two adjacent fins. The retaining body includes a pair of opposite lateral walls (260) clamping opposite sides of the two adjacent fins, for preventing the two adjacent fins from being over expanded outwardly during the insertion of the screw into the space.

17 Claims, 5 Drawing Sheets

HEAT SINK ASSEMBLY HAVING A FAN MOUNTING DEVICE

FIELD OF THE INVENTION

The present invention relates generally to a heat sink assembly, and particularly to a heat sink assembly for cooling an electronic element such as a CPU by the use of a heat sink which is mounted with a fan via a fan handle.

DESCRIPTION OF RELATED ART

A computer central processing unit (CPU) is the core administrator of electrical signals in most contemporary personal computers. Continued development of CPUs has enabled them to perform more and more functions. Heat generated by the CPUs has increased enormously. Such heat can adversely affect the operational stability of the computers. Measures must be taken to efficiently remove the heat from the CPU. Typically, a heat sink having great heat conductivity is mounted on the CPU to remove heat therefrom. A fan is often attached to the heat sink to provide forced airflow to the heat sink.

A conventional heat dissipation assembly as shown in FIG. 5 includes a fan 1 and a heat sink 3. The fan 1 defines four through holes 2 in four corners thereof. The heat sink 3 comprises a base 4 for contacting with a heat-generating electronic device, and a plurality of parallel fins 5 extending upwardly from the base 4. A threaded hole 6 is formed between two outmost fins 5 and at each of four corners of the heat sink 3. Four screws 7 are extended through the through holes 2 and engaged in the threaded holes 6, respectively. Thus, the fan 1 is securely mounted on the heat sink 3. However, the process to form the threaded holes 6 is unduly time-consuming and raises production costs. Furthermore, the outmost fins 5 are prone to deform under pressure from the screws 7. This can lead to a breakage of the outmost fins 7. Furthermore, in operation, the screws 7 are prone to be loosened by vibration and thereby make noise.

SUMMARY OF INVENTION

Accordingly, what is needed is a heat sink assembly having a fan handle for facilitating to firmly fasten a fan to a heat sink.

According to a preferred embodiment of the present invention, a heat sink assembly comprises a heat sink, a fan and a plurality of fasteners mounting the fan onto the heat sink. The heat sink comprises a solid core and a plurality of fins projecting outwardly from the core. Each fastener comprises a self-tapping screw and a fan handle. The fan handle buckled with the fins comprises a retaining body clasping two adjacent fins therein. The retaining body has a pair of opposite lateral walls. The fan handle further has an elongated L-shaped connecting portion extending from the retaining body, and a block portion extending from and perpendicular to the connecting portion. The opposite lateral walls have inner surfaces thereof abutting against opposite sides of the two adjacent fins. A pair of arms extends upwardly from upper edges of the lateral walls of the retaining body, respectively. A channel is defined between the arms and communicates with a space defined between the two adjacent fins. Each screw has a protrusion thereon which extends through the fan into the space between the two adjacent fins to threadedly engage with the two adjacent fins. During the tapping of the screw, the screw is clamped by the arms so that the screw can be more stably held in position. The lateral walls firmly clasp the two adjacent fins therebetween for preventing the two adjacent fins from being over expanded outwardly during the screw-in of the screw.

Other advantages and novel features of the present invention will become more apparent from the following detailed description of preferred embodiment when taken in conjunction with the accompanying drawings, in which:

DETAILED DESCRIPTION

Figure 1:
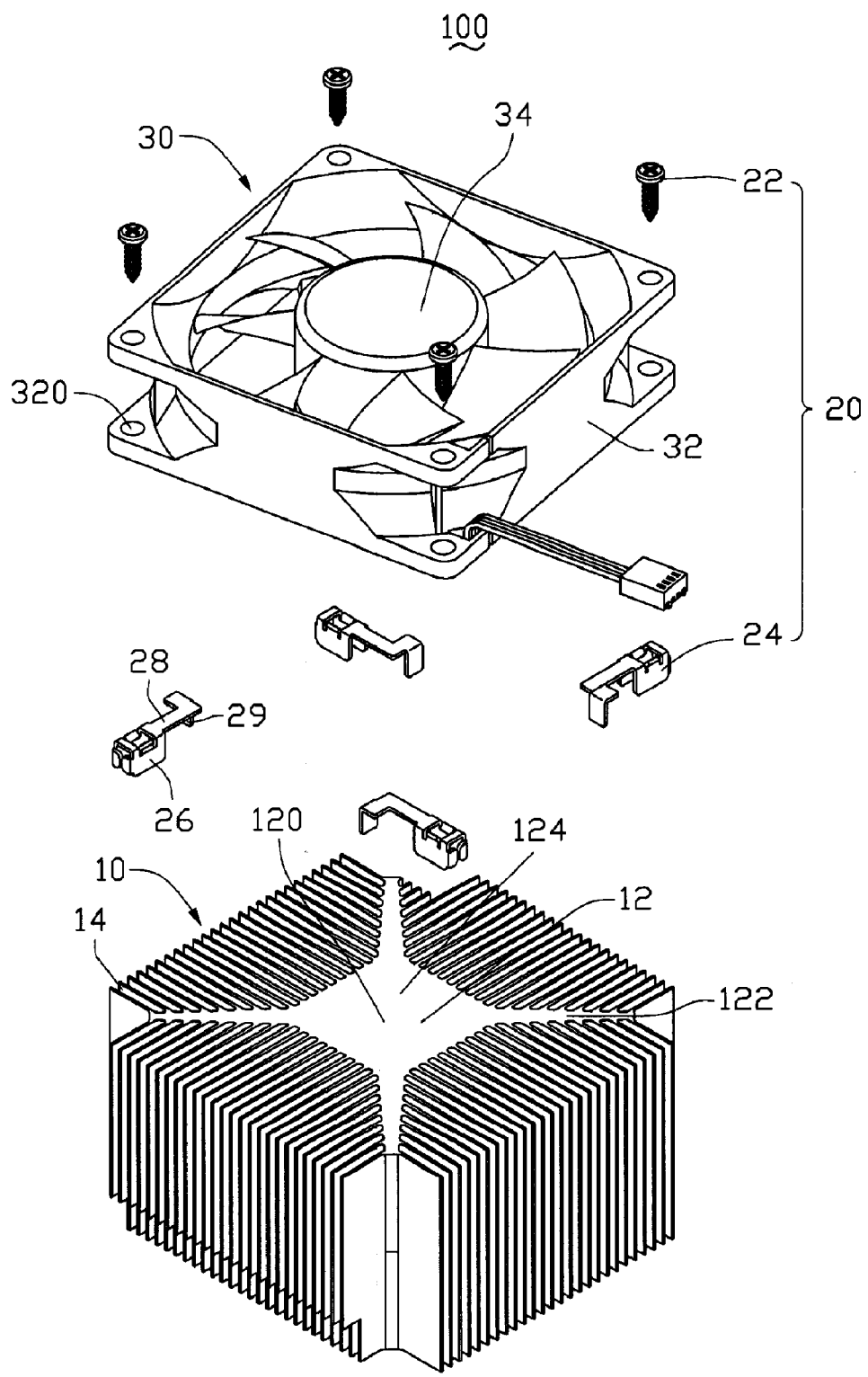
FIG. 1 is an exploded, isometric view of a heat sink assembly according to a preferred embodiment of the present invention.

Referring to FIG. 1, a heat sink assembly 100 according to a preferred embodiment of the present invention comprises a heat sink 10, a plurality of fasteners 20 and a fan 30 mounted on the heat sink 10 via the fasteners 20.

The heat sink 10 comprises a solid core 12 and a plurality of fins 14 projecting outwardly from the core 12. The fins 14 can be divided into four groups oriented at four different directions, respectively. Two neighboring groups of the fins 14 are oriented perpendicularly to each other. The core 12 comprises a central portion 120 shaped similar to a cube and four ears 122 extending outwardly from the central portion 120. The core 12 has a substantially planar top surface 124 and a substantially planar bottom surface (not shown) corresponding to the top surface 124. The top surface 124 of the core 12 is for supporting the fan 30, and the substantially planar bottom surface of the core 12 is adapted to contact a heat source (not shown), for example, a CPU. Four side surfaces of the central portion 120 and the four ears 122 form four regions. Each group of the fins 14 is formed at a corresponding region.

Figure 2:
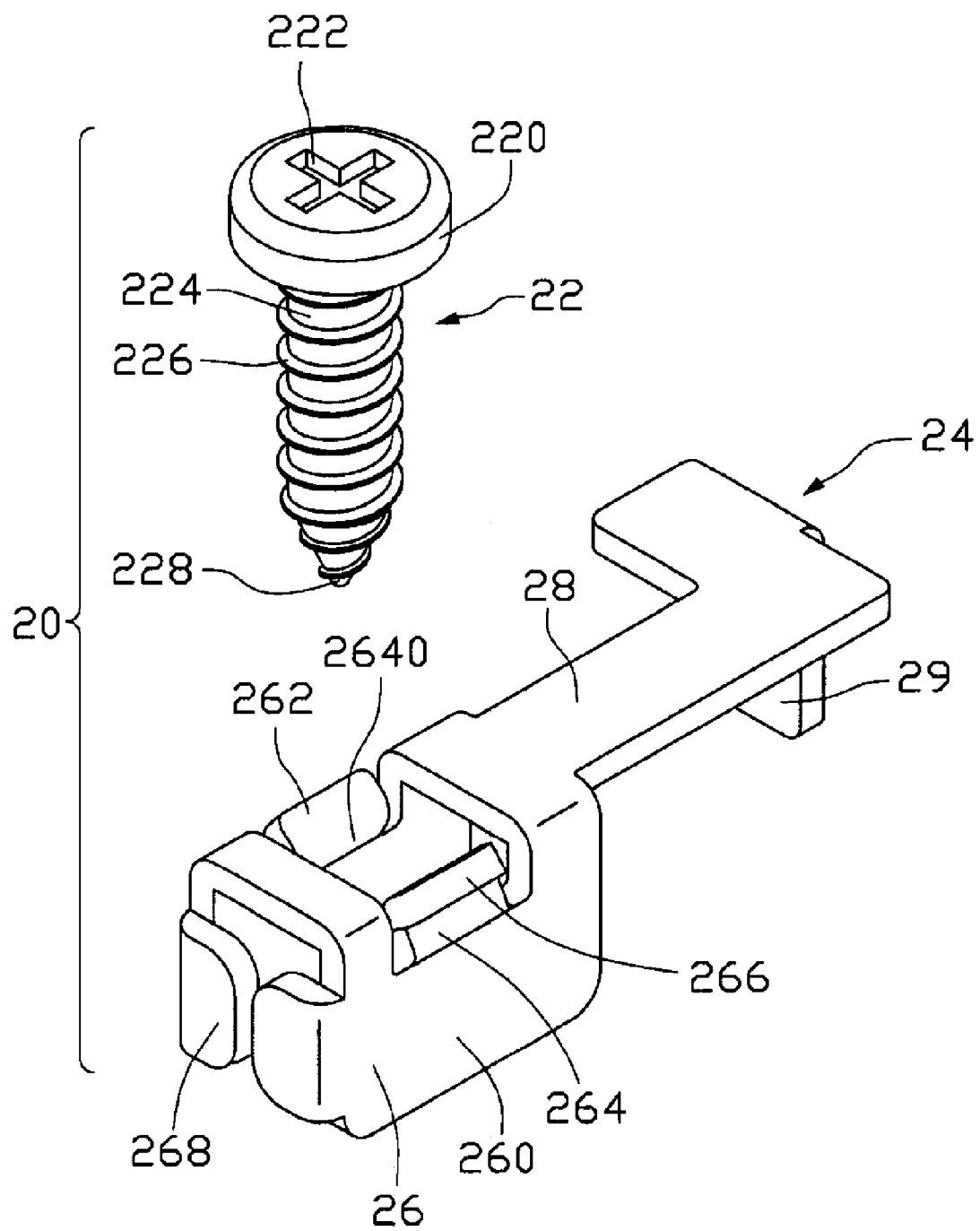
FIG. 2 is an enlarged view of a fastener of the heat sink assembly of FIG. 1.
Figure 3:
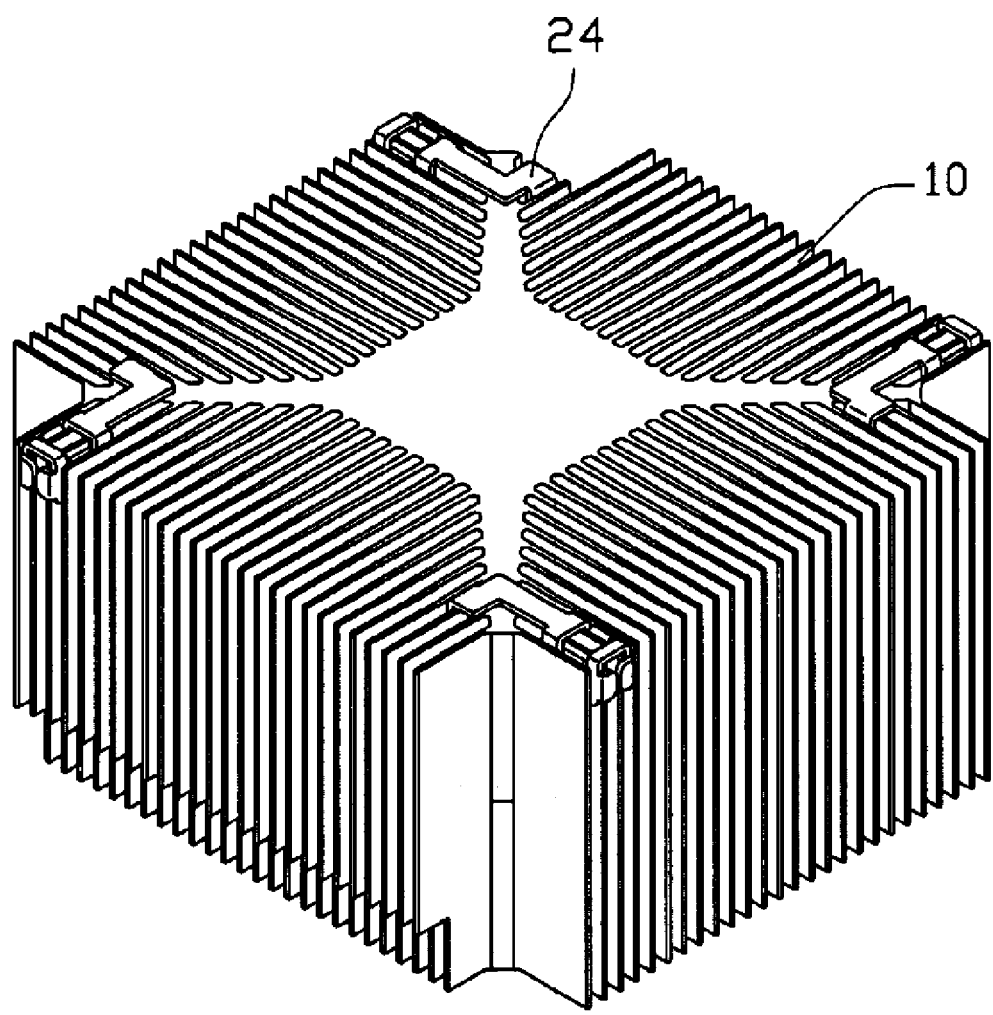
FIG. 3 is an assembled view of the fastener and a heat sink of the heat sink assembly of FIG. 1.
Figure 4:
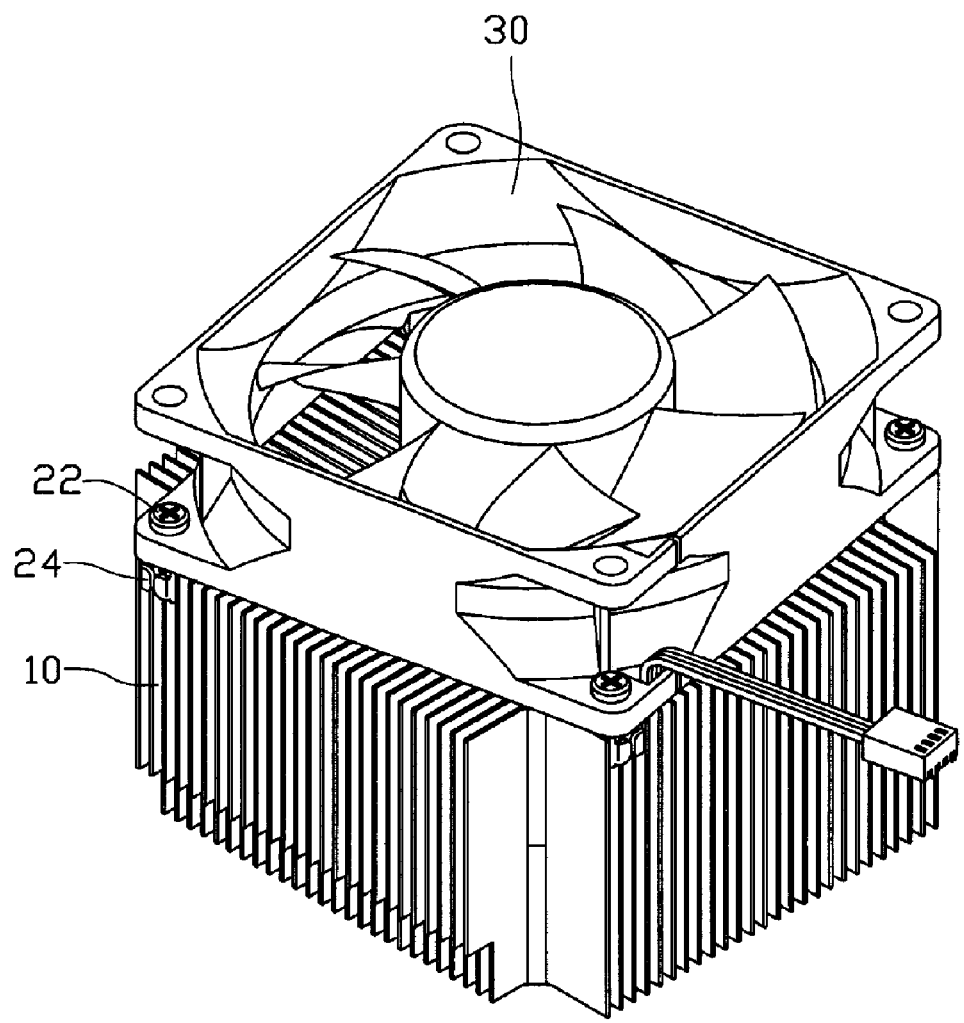
FIG. 4 is an assembled view of FIG. 1.
Figure 5:
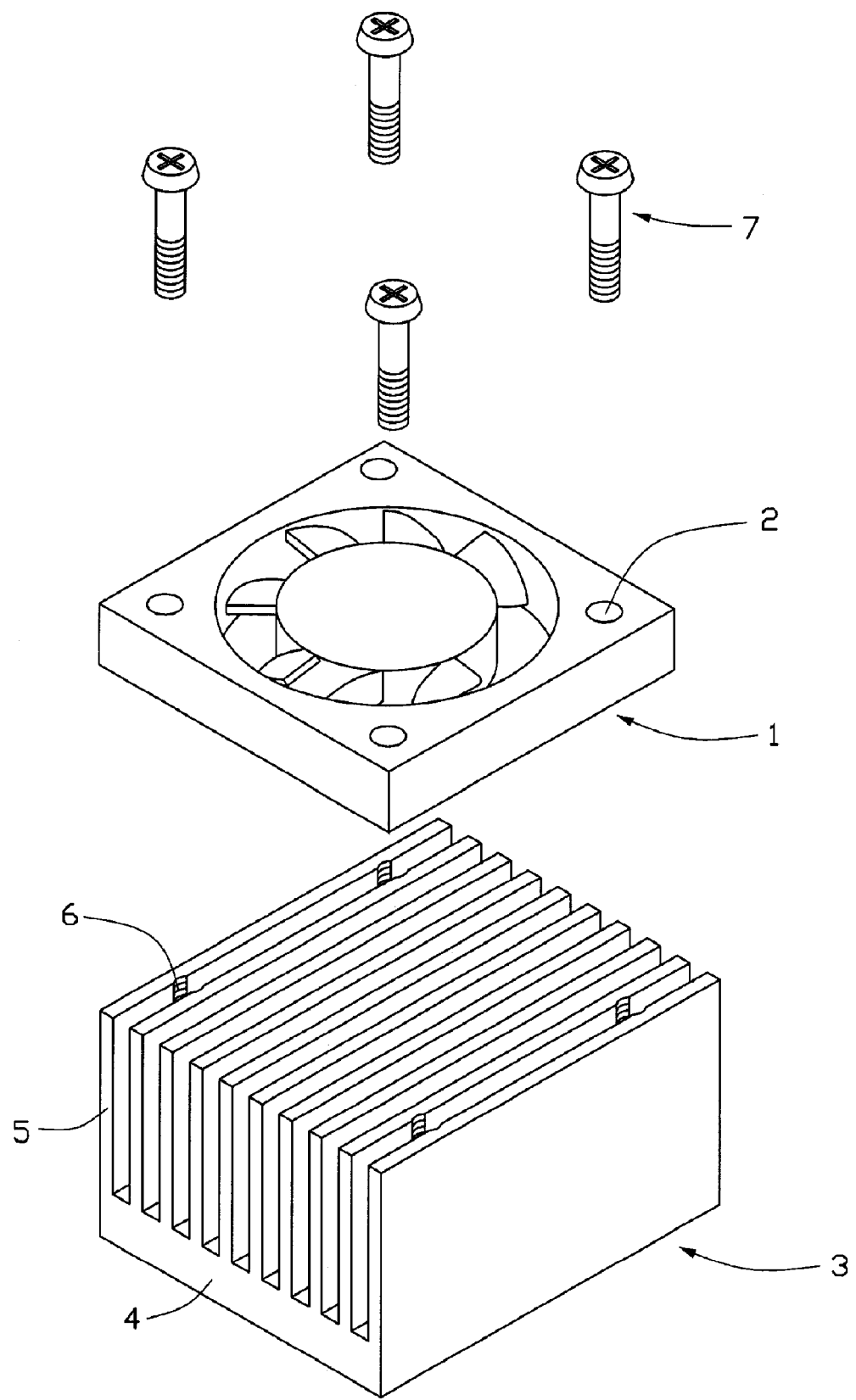
FIG. 5 is an assembled view of a conventional heat sink assembly.

Also referring to FIGS. 2 and 3, each of the fastener 20 buckled with the fins 14, comprises a self-tapping screw 22 and a fan handle 24, for mounting the fan 30 to top of the heat sink 10. The screw 22 comprises a circular head 220 having a cross slot 222 in a top thereof, and a shaft 224 extending downwardly from the head 220. A helical protrusion 226 is circumferentially formed on the shaft 224 and extended throughout the length of the shaft 224. The protrusion 226 forms an external thread for the screw 22. The shaft 224 terminates with a guiding portion 228 having a conic shape.

The fan handle 24 in accordance with the preferred embodiment of the present invention is formed by stamping a single piece of metal. The fan handle 24 comprises a retaining body 26 for clasping two adjacent fins 14 in one group of the fins 14, an elongated L-shaped connecting portion 28 extending from the retaining body 26, and a block portion 29 extending from a free end of and perpendicular to the connecting portion 28. The retaining body 26 comprises a pair of opposite lateral walls 260 with inner surfaces thereof abutting against sides of the two adjacent fins 14 facing opposite directions. A width of a space between the two adjacent fins 14 is smaller than an outer diameter of the screw 22 such that the screw 22 can be inserted into the space and threadedly engage with the two adjacent fins 14 by self-tapping. A width between facing sides of the lateral walls 260 is substantially the same as that between the opposite sides of the two adjacent fins 14 such that the walls 260 can clasp the two adjacent fins 14 therebetween for preventing the two adjacent fins 14 from being deformed outwardly during the screwing of the screw 22 into the space between the two adjacent fins 14. A pair of spring arms 262 extends upwardly from upper edges of the lateral walls 260 of the retaining body 26, respectively. A channel between the arms 262 communicates with the space between the two adjacent fins 14. Each spring arm 262 comprises a lower arm 264. The lower arm 264 is bent inwardly to form a contact ridge 2640 so that the lower arms 264 are spaced more closely together than the lateral walls 260. The contact ridges 2640 of the spring arms 262 are for sandwiching the inserted screw 22 therebetween. The spring arm 262 further comprises an upper arm 266 bent outwardly from the contact ridge 2640, for facilitating the insertion of the screw 22. The retaining body 26 comprises a pair of latches 268 extending inwardly from an end of and perpendicular to the lateral walls 260 at a position remote from the block portion 29, for abutting against outer ends of the adjacent fins 14.

The fan 30 comprises a frame 32 and a motor 34 received in the frame 32. The frame 32 has a square configuration, and comprises four corners. A through hole 320 is defined at each corner, for permitting passage of the screw 22.

Referring to FIGS. 1-4, in assembly of the heat sink assembly 100, each screw 22 extends through the through hole 320 of the fan 30. The opposite lateral walls 260 of each retaining body 26 of each fan handle 24 are abutting against the opposite sides of the two adjacent fins 14 disposed at a first region, which means, the two adjacent fins 14 is sandwiched between the lateral walls 260, for preventing the two adjacent fins 14 from being over expanded outwardly during the insertion of the screw 22. The connecting portion 28 of the fan handle 24 is placed on the fins 14. The block portion 29 of the fan handle 24 clasps a fin 14 disposed at a second region adjacent to the first region. The latches 268 of the fan handle 24 clasp the outer ends of the two adjacent fins 14 disposed at the first region, thereby the fan handle 24 is thus securely and firmly mounted on the heat sink 10. The screw 22 is inserted towards the space between the two adjacent fins 14 sandwiched by the fan handle 24 until the protrusion 226 of the screw 22 fully threadely engages with two adjacent fins 14 and the fan 30 is tightly secured on the top of the fins 14 of the heat sink 10. During the insertion of the screw 22, the spring arms 262 are resiliently expanded outwardly and generates an inwardly resilient force to clamp the screw 22 therebetween, thereby to help stabilizing the screw 22 during its threaded engagement with the adjacent fins 14.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat sink assembly, comprising:
   a heat sink comprising a plurality of outwardly extending fins;
   a plurality of fasteners, each of the fasteners comprising a screw and a fan handle, the fan handle buckled with the fins and comprising a retaining body having a pair of opposite walls with inner surfaces thereof abutting against opposite sides of two adjacent fins; and
   a fan mounted on the heat sink via the fasteners;
   wherein the screw extends between the two adjacent fins, the walls of the fan handle firmly clasps the opposite sides of the two adjacent fins for preventing the two adjacent fins from being over expanded outwardly during the insertion of the screw wherein the fan handle further comprises a connecting portion extending from the retaining body and a block portion extending from and perpendicular to the connecting portion, the block portion clasps one of the fins other than the two adjacent fins.

2. The heat sink assembly as described in claim 1, wherein a pair of spring arms extends upwardly from upper edges of the lateral walls, the screw is sandwiched between the spring arms.

3. The heat sink assembly as described in claim 1, wherein the connecting portion is L-shaped.

4. The heat sink assembly as described in claim 1, wherein the retaining body comprises a pair of latches extending inwardly from and perpendicular to the opposite walls.

5. The heat sink assembly as described in claim 2, wherein the screw defines a protrusion threadedly engaging with the opposite walls of the retaining body.

6. The heat sink assembly as described in claim 5, wherein the protrusion has a helical shape, and the protrusion is an external thread.

7. The heat sink assembly as described in claim 2, wherein the arms comprise lower arms bent inwardly to form contact ridges clamping the screw, and upper arms bent outwardly from the contact ridges.

8. The heat sink assembly as described in claim 1, wherein the heat sink comprises a solid core and the fins projecting outwardly from the core.

9. A heat sink assembly comprising:
   a heat sink comprising a plurality of fins;
   a fan handle buckled with the fins and comprising a retaining body clasping two adjacent fins having a space therebetween, the retaining body comprising a pair of opposite lateral walls with inner surfaces thereof abutting against opposite sides of the two adjacent fins, and a pair of spring arms extending upwardly from upper edges of the lateral walls, the spring arms having a channel therebetween communicating with the space;
   a fan mounted on the heat sink via the fan handle; and
   wherein the fan handle further comprises a connecting portion extending from the retaining body, and a block portion extending perpendicularly from the connecting portion and clasping one of the fins of the heat sink other than the two adjacent fins
   a plurality of screws passing through the fan and into the space of the two adjacent fins, the screw being engaged with the arms and the adjacent fins, wherein the screw is threadedly engaged with the adjacent fins.

10. The heat sink assembly as described in claim 9, wherein the heat sink comprises a solid core and the fins projecting outwardly from the core.

11. The heat sink assembly as described in claim 9, wherein the arms comprise lower arms bent inwardly to form contact ridges clamping the screw, and upper arms bent outwardly from the contact ridges.

12. The heat sink assembly as described in claim 9, wherein the fin clasped by the block of the fan handle and the two adjacent fins clasped by the retaining body of the fan handle are oriented to different directions.

13. A heat sink assembly comprising:
- a heat sink having a central core and a plurality of fins extending outwardly from the core;
- a handle having a retaining body sandwiching two adjacent fins therein;
- a fan mounted on the heat sink; and
- a self-tapping screw extending through the fan into a space between the two adjacent fins to have a threaded engagement with the two adjacent fins thereby securely mounting the fan to the heat sink wherein the handle has a block portion engaging with one of the fins other than the two adjacent fins.

14. The heat sink assembly as described in claim 13, wherein the two adjacent fins are oriented at a first direction and the one of the fins is oriented at a second direction different from the first direction.

15. The heat sink assembly as described in claim 14, wherein the first direction is perpendicular to the second direction.

16. The heat sink assembly as described in claim 13, wherein the handle has a pair of spring arms located above the retaining body and clamping the screw therebetween.

17. The heat sink assembly as described in claim 13, wherein the handle has a pair of latches engaging with outer ends of the two adjacent fins.

\* \* \* \* \*